(12) United States Patent
Elenes (10) Patent No.: US 8,949,302 B2
(45) Date of Patent: Feb. 3, 2015

(54) DIGITAL FRONT END FOR OVERSAMPLED LOW-IF OR ZERO-IF MULTIMODE RECEIVERS

(75) Inventor: Javier Elenes, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 757 days.

(21) Appl. No.: 13/173,365

(22) Filed: Jun. 30, 2011

(65) Prior Publication Data

US 2013/0007082 A1    Jan. 3, 2013

(51) Int. Cl.
*G06F 17/17* (2006.01)
*H04B 1/00* (2006.01)
*H03M 3/00* (2006.01)

(52) U.S. Cl.
CPC ............. *H04B 1/0021* (2013.01); *H03M 3/344* (2013.01); *H04B 1/001* (2013.01); *H03M 3/462* (2013.01)
USPC .......................................................... 708/313

(58) Field of Classification Search
CPC .......... H03H 17/0664; H03H 17/0657; H03H 17/0671; H03H 17/0685; G06F 17/17
USPC .......................................................... 708/313
See application file for complete search history.

(56) References Cited

U.S. PATENT DOCUMENTS

| | | | |
|---|---|---|---|
| 6,608,572 B1 * | 8/2003 | Venkitachalam et al. | 341/61 |
| 7,436,333 B2 * | 10/2008 | Forman et al. | 708/313 |
| 7,835,468 B2 | 11/2010 | Elenes et al. | |
| 8,374,300 B2 * | 2/2013 | Komalil et al. | 375/346 |
| 8,405,532 B1 * | 3/2013 | Clark et al. | 708/300 |
| 2006/0179095 A1 * | 8/2006 | Lo Muzio et al. | 708/300 |
| 2009/0077149 A1 * | 3/2009 | Tsutsui et al. | 708/313 |
| 2009/0298453 A1 | 12/2009 | Elenes | |
| 2011/0075720 A1 | 3/2011 | Elenes | |
| 2012/0246210 A1 * | 9/2012 | Pan et al. | 708/313 |

* cited by examiner

*Primary Examiner* — Tan V. Mai
(74) *Attorney, Agent, or Firm* — Abel Law Group, LLP (57) ABSTRACT

A digital radio signal is processed by converting an analog signal to a digital signal, decimating the digital signal using a CIC filter and supplying the decimated digital signal directly to an asynchronous sample rate converter (ASRC). The decimated signal is resampled in the ASRC and the ASRC output is supplied directly to a droop compensation filter to compensate the output of the ASRC. By carefully choosing the response of the CIC filter and the resample rate of the ASRC, aliased artifacts in the pass band can be kept below a threshold magnitude without the need for a channelization filter.

22 Claims, 12 Drawing Sheets

DIGITAL FRONT END FOR OVERSAMPLED LOW-IF OR ZERO-IF MULTIMODE RECEIVERS

BACKGROUND

1. Field of the Invention

This invention relates to radio frequency (RF) receivers and more particularly to RF receivers for digital radio.

2. Description of the Related Art

Digital radio implementations include an approach that simulcasts a conventional frequency modulated (FM) signal with two digital sidebands approximately 100 kHz wide containing the digital radio information. Orthogonal frequency division multiplexing (OFDM) is used to provide digitally modulated subcarriers in the sidebands conveying the digital radio information. Another digital radio standard, Digital Audio Broadcast (DAB), uses OFDM without simulcast. One aspect of digital radio and OFDM in particular is that it is important to lock the receiver to the carrier frequency and to the symbol rate.

Figure 1:
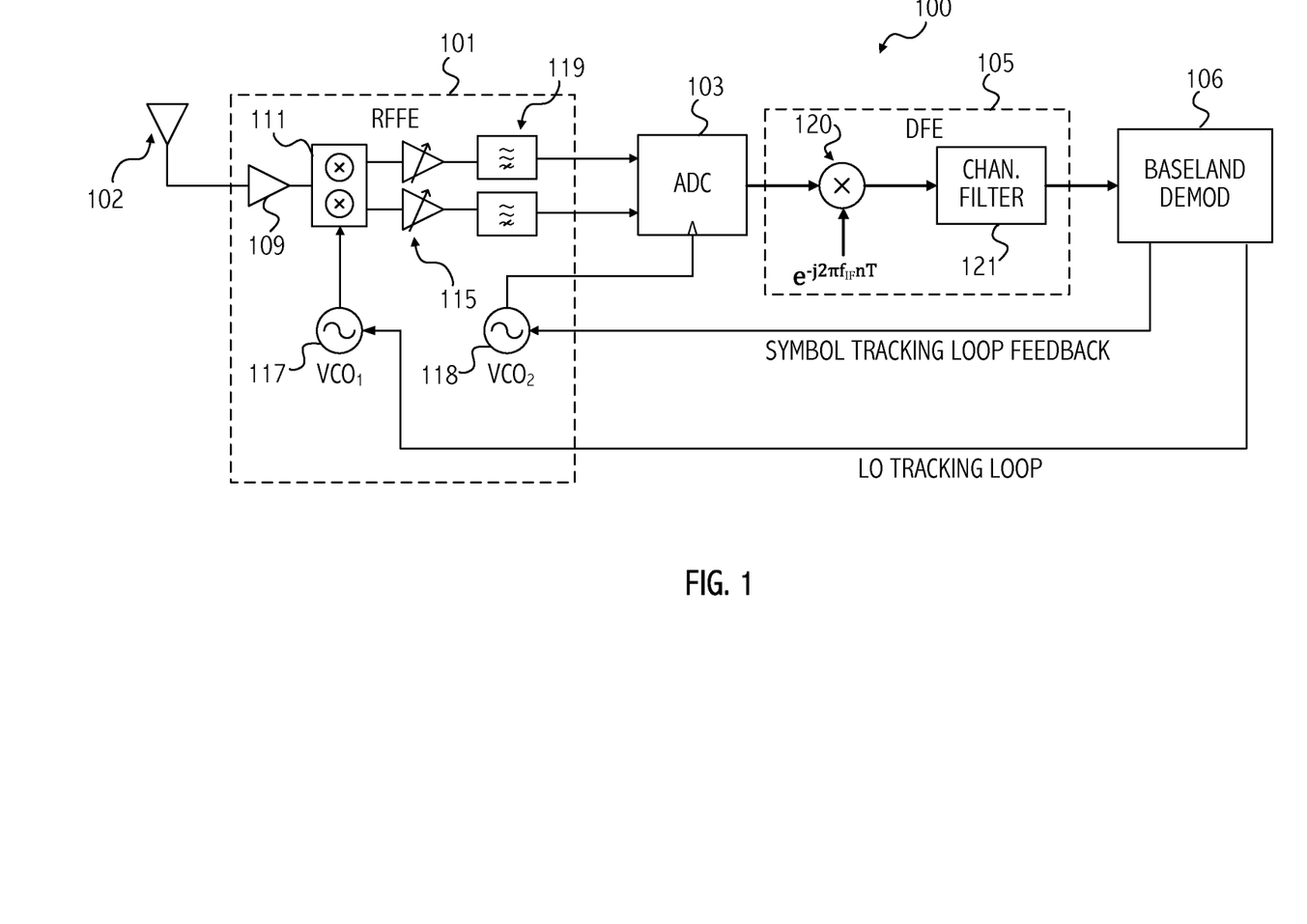
FIG. 1 illustrates a block diagram of a typical low-IF receiver.

A block diagram of a typical low-IF receiver is shown in FIG. 1. A typical low-IF receiver 100 includes an analog RF front end (RFFE) 101 coupled to receive signals from an antenna 102, an analog to digital converter (ADC) 103, a digital front end (DFE) 105, and a baseband demodulator (BB) 106. The RFFE 101 typically includes a low noise amplifier (LNA) 109, mixers 111, programmable gain amplifiers 115, oscillators 117 and 118 and analog low-pass filters 119. The DFE 105 converts a low-IF or zero-IF digitized signal from ADC 103 into a baseband channelized signal sampled at a rate suitable for demodulation. Typical operational blocks of the DFE include digital frequency rotation 120 and a channel filter 121 to remove undesired out-of-band signals.

The RFFE shown in FIG. 1 has two voltage controlled oscillators (VCOs) 117 and 118, used to generate a mixer local oscillator (LO) signal and an ADC sampling clock, respectively. The architecture shown in FIG. 1 allows independent adjustment of the sampling and LO clocks by the BB 106. For digital demodulation the BB may adjust the ADC sampling clock in order to align the sampling instants to the transmitted symbols (symbol tracking loop).

For low power applications, e.g., for portable digital radio applications, improvements with respect to power, efficiency, and/or area are desirable.

SUMMARY

Improvements can be achieved in a digital radio receiver. In an embodiment a digital radio signal is processed by converting an analog signal to a digital signal, decimating the digital signal using a CIC filter and supplying the decimated digital signal directly to an asynchronous sample rate converter (ASRC). By carefully choosing the response of the CIC filter and the resample rate of the ASRC, aliased artifacts in the pass band can be kept below a threshold magnitude without the need for a channelization filter.

In an embodiment, the decimated signal is resampled in the ASRC and the ASRC output is supplied directly to a droop compensation filter to droop compensate the output of the ASRC.

An embodiment provides a method that includes decimating a digital signal provided by an analog to digital converter and supplying the decimated digital signal to an asynchronous sample rate converter (ASRC). The ASRC resamples the decimated digital signal to generate a resampled signal. The method may further include a droop compensation filter receiving the resampled signal and compensating for droop in the band of interest caused by the decimation. The decimation may be implemented using a cascaded integrated comb (CIC) decimation filter. By appropriately choosing the response of the CIC filter and the resample rate of the ASRC, aliased artifacts in the pass band can be kept below a threshold magnitude without the need for a channelization filter. That is, a magnitude of a wanted signal in a desired frequency band at an aliased frequency is greater by a predetermined margin K than an aliased image at an aliased frequency in the desired frequency band.

In another embodiment a radio receiver includes a decimation filter to provide a decimated digital signal. An asynchronous sample rate converter (ASCR) is coupled to receive the output of the decimated digital signal and resample the decimated digital signal to provide a resampled signal. In an embodiment, a droop compensator receives the resampled signal and droop compensates the resampled signal. The decimation filter may be implemented as a cascaded integrated comb (CIC) decimation filter.

In an embodiment a digital radio receiver includes an analog radio frequency front end to receive a digital radio signal and supply an analog output corresponding to the digital radio signal. An oversampled delta sigma analog to digital converter is coupled to receive the analog output and supply a digital signal. A cascaded integrated comb (CIC) decimation filter is coupled to the analog to digital converter to decimate the digital signal to provide a decimated digital signal. An ASCR resamples the decimated digital signal and provides a resampled signal to a droop compensation filter to droop compensate the resampled signal.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 2:
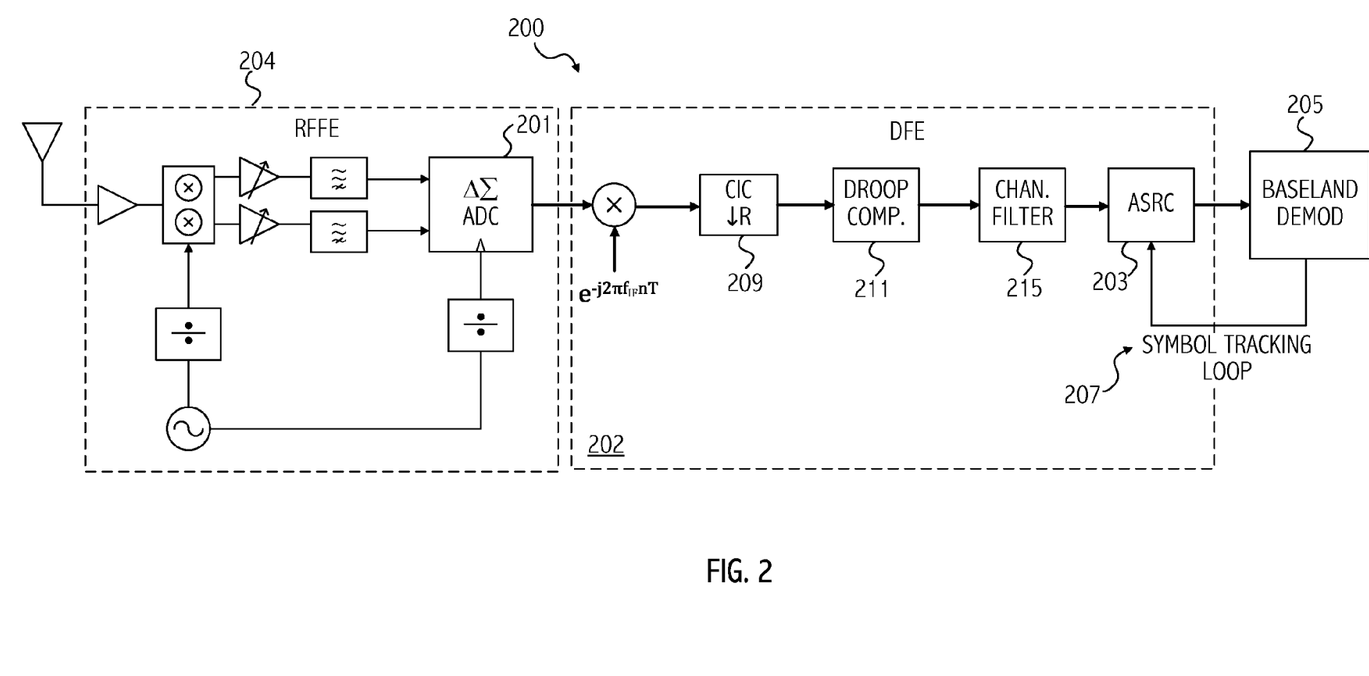
FIG. 2 illustrates a block diagram of another low-IF receiver with improvements over the architecture of the receiver in FIG. 1.

The architecture shown in FIG. 2 introduces several improvements over the architecture shown in FIG. 1. The architecture 200 in FIG. 2 uses an oversampled ADC 201 which greatly reduces the cost of the analog anti-aliasing filter required in the RFFE. The oversampled delta sigma ADC allows noise shaping to help ensure noise is outside of bands of interest. In addition, oversampled delta sigma ADC requires fewer bits (e.g., one bit) to quantize the signal and therefore reduces the cost of the complex multiply operation used for frequency de-rotation. The sample rate may be chosen to be an integer multiple of the IF frequency allowing the use of a lookup table to generate the complex exponential in the DFE 202. An asynchronous sample rate converter (ASRC) 203 is introduced in the DFE, eliminating the need for a separate VCO to generate the ADC sampling clock. In this case, the BB symbol tracking loop 207 adjusts the ASRC output rate. The embodiment illustrated in FIG. 2 also includes a cascaded integrated comb (CIC) decimation filter 209. The CIC filter introduces in-band droop. As shown in FIG. 2, the CIC output is droop compensated in droop compensation filter 211 to ensure the pass band is flat. Any undesired in-band signals are removed by a channelization filter prior to resampling in order to reduce ASRC aliasing artifacts. If not properly filtered, ASRC aliasing artifacts may land in-band and degrade the wanted signal.

The cost of the droop compensation and channelization filters in this configuration can be significant as these filters have somewhat conflicting requirements. Assume, for example, a large first adjacent blocker. It is desirable to attenuate the first adjacent blocker before resampling in ASRC, or aliasing can occur in-band. In Digital Audio Broadcasting (DAB) a 45 dB adjacent blocker could alias in-band, swamping the desired signal. Thus, the channelization filter attenuates undesired out of band signals to avoid aliasing of a large signal into a frequency band of interest as a result of the ASRC resampling. In contrast, the droop compensation filter is attempting to boost the signal at higher frequencies to compensate for droop.

Figure 3:
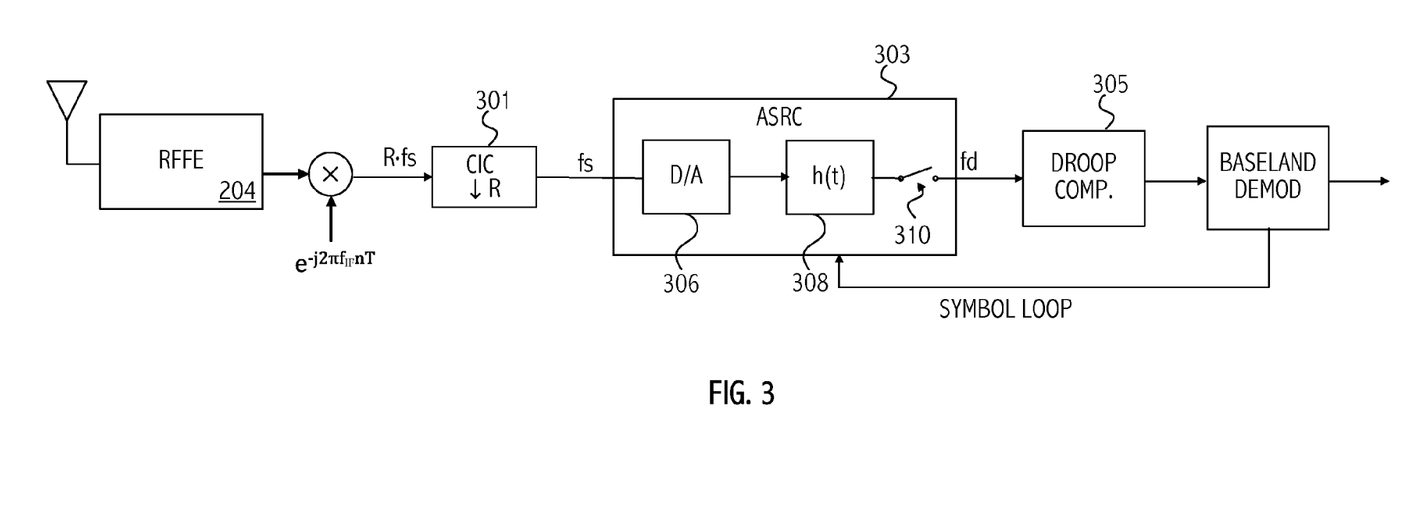
FIG. 3 illustrates an embodiment of the invention in which the channelization filter is omitted and droop compensation is performed after the asynchronous sample rate converter (ASRC).

An embodiment of the invention removes the channelization filter altogether by appropriately selecting the CIC response (decimation rate and attenuation) and output rate of the ASRC. Careful selection of sampling frequencies and decimation rate force artifacts to land out of band. The CIC filter can be relied on to act as a channelization filter. Referring to FIG. 3, CIC decimation filter 301 supplies the ASRC block 303 (as compared to the droop compensation filter in FIG. 2). The RFFE is assumed to be the same as that shown in FIG. 2. The ASRC 301 is applied to the output of CIC decimation filter 301 directly as shown in FIG. 3. Droop compensation in droop compensation filter 305 is applied to the ASRC output. Note that droop compensation is implemented at the (lower rate) ASRC output rate fd as shown in FIG. 3, as compared to fs in FIG. 2.

As illustrated conceptually in FIG. 3, the ASRC operation is mathematically equivalent to passing the digital signal from the CIC through an ideal D/A converter 306, passing the signal thru a low-pass reconstruction filter with impulse response h(t) 308, and sampling the resulting signal at the output rate fd 310. Images at multiples of the ASRC input rate fs alias into the Nyquist band at the output rate fd. The idea is to keep the aliased images below a desired level relative to the wanted signal.

Equation 1 can be used to compute the aliased frequencies for a given sample rate fs and aliasing frequency f:

$$\text{alias}(f, f_S) = \text{mod}\left(f + \frac{f_S}{2}, f_S\right) - \frac{f_S}{2} \tag{Eq. 1}$$

Equation 2 represents the decimated CIC magnitude response where fs is the CIC output sample rate.

$$H_C(f) = H_{CIC}(\text{alias}(f, f_S)) \tag{Eq. 2}$$

Equation 3 represents the composite response of the CIC and reconstruction filter.

$$H(f) = H_C(f) \cdot H_R(f) \tag{Eq. 3}$$

Equation 4 represents the output when an input signal X(f) is supplied to the system of equation 3.

$$Y(f) = X(f)H(f), \text{ where } X(f) = \text{input signal} \tag{Eq. 4}$$

Equation 5 represents the condition to be met, namely, the magnitude of the aliasing image from the ASRC is smaller by a predetermined margin K than the magnitude of the wanted signal at the aliased frequency.

$$20 \log_{10}|Y(\text{alias}(f, f_D))| > 20 \log_{10}|Y(f)| + K \tag{Eq. 5}$$

where fd represents the ASRC output rate, |Y(alias (f,$f_D$))| represents the wanted signal magnitude at the aliased frequency, and |Y(f)| represents the magnitude of the aliasing image.

Figure 4A:
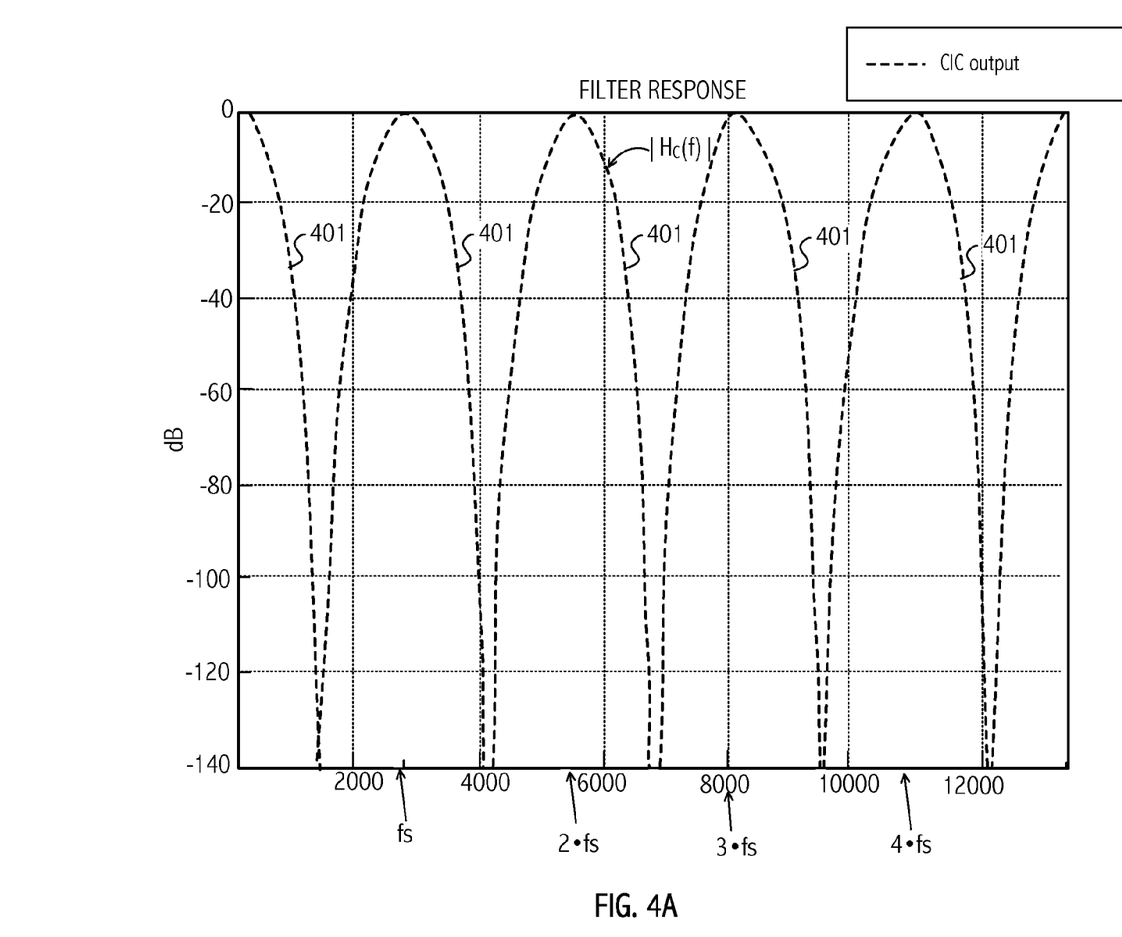
FIG. 4A illustrates the output of the CIC filter.
Figure 4B:
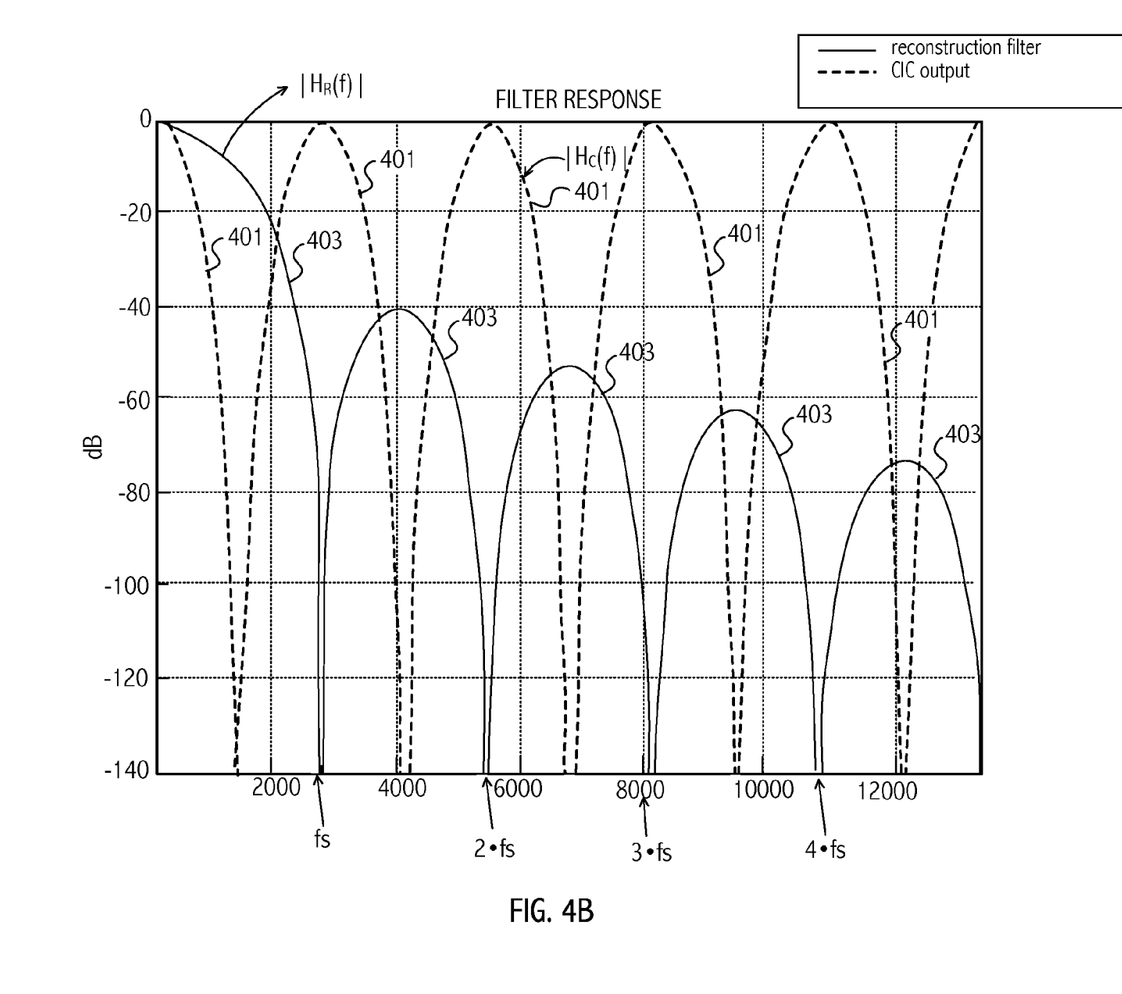
FIG. 4B illustrates the output of the CIC filter and the reconstruction filter.
Figure 4C:
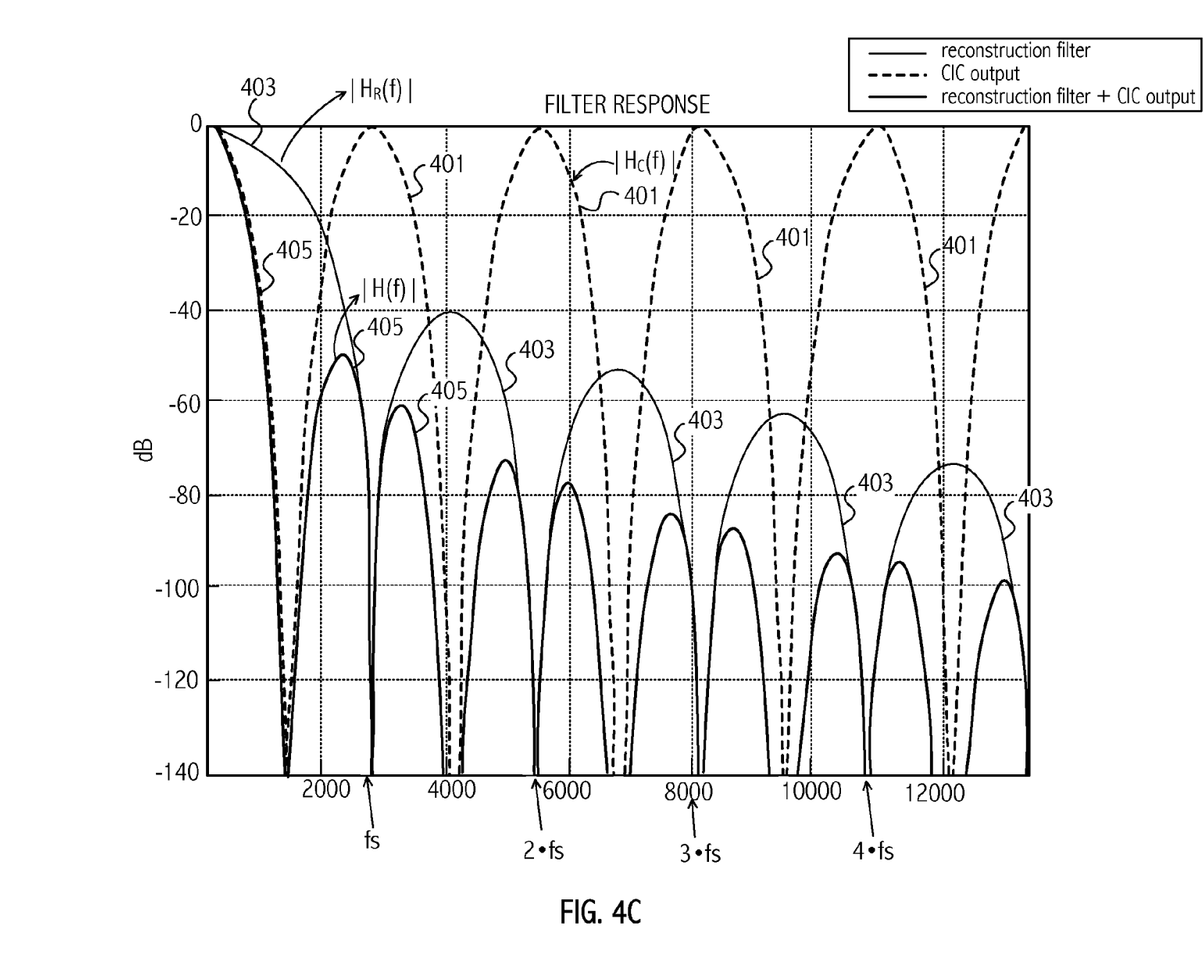
FIG. 4C illustrates the CIC filter and the reconstruction filter and the composite response.

FIG. 4A shows the decimated CIC response 401 after passing through an ideal DAC, having replicas of itself at multiples of fs, in accordance with equation 2. FIG. 4B adds the reconstruction filter response $H_R(f)$ 403 that attenuates images at multiples of fs to substantially eliminate the replicas. FIG. 4C adds the composite response 405 of the CIC response and the reconstruction filter.

Figure 5:
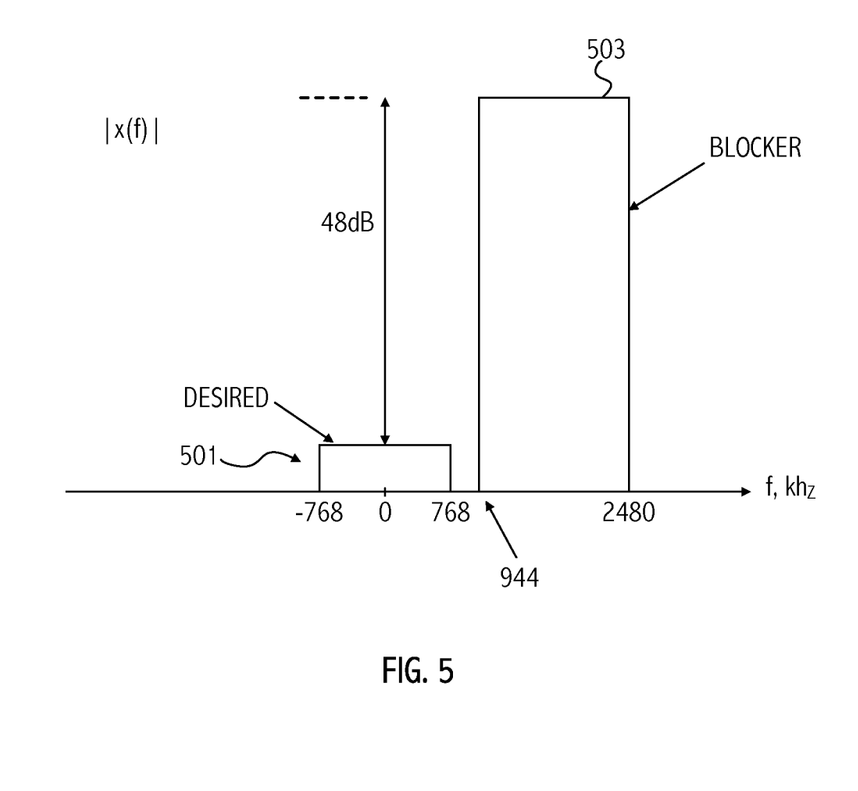
FIG. 5 illustrates an exemplary CIC input spectrum.

FIG. 5 illustrates an exemplary CIC input spectrum. Specifically, in the exemplary input spectrum there is a Digital Audio Broadcasting (DAB) signal with a desired signal 501 and a +48 dB first adjacent blocker 503. The desired signal occupies the frequencies between −768 and 768 kHz, and the blocker 503 occupies the frequencies between 944 and 2480 kHz. Assume the ADC (see ADC 201 in FIG. 2) sampling rate is 60 Ms/s. Assume also that a 5th order CIC decimator is used with a decimation rate R=22 in CIC decimation filter 301. That results in a sampling rate fs at the input to ASRC 303 of approximately 2.727 MHz. The ASRC resamples from fs=2.727 MHz to fd=2.048 MHz. For an exemplary embodiment it is desired to keep aliasing artifacts below 15 dB in the signal band. That is, K=15 in equation 5. In this particular embodiment, the resampling rate of 2.048 is the DAB base rate. DAB broadcasts symbols at submultiples of the base rate. Thus, one can adjust the CIC response in terms of decimation rate and attenuation to help ensure that artifacts resulting from resampling meet the requirements of equation 5. Note that the ADC rate for ADC 201 can also be used to affect the output of the CIC in a similar manner to adjusting the decimation rate. For an HD radio embodiment, the base sampling rate out of the ASRC will be 744.1875 kHz.

Figure 6:
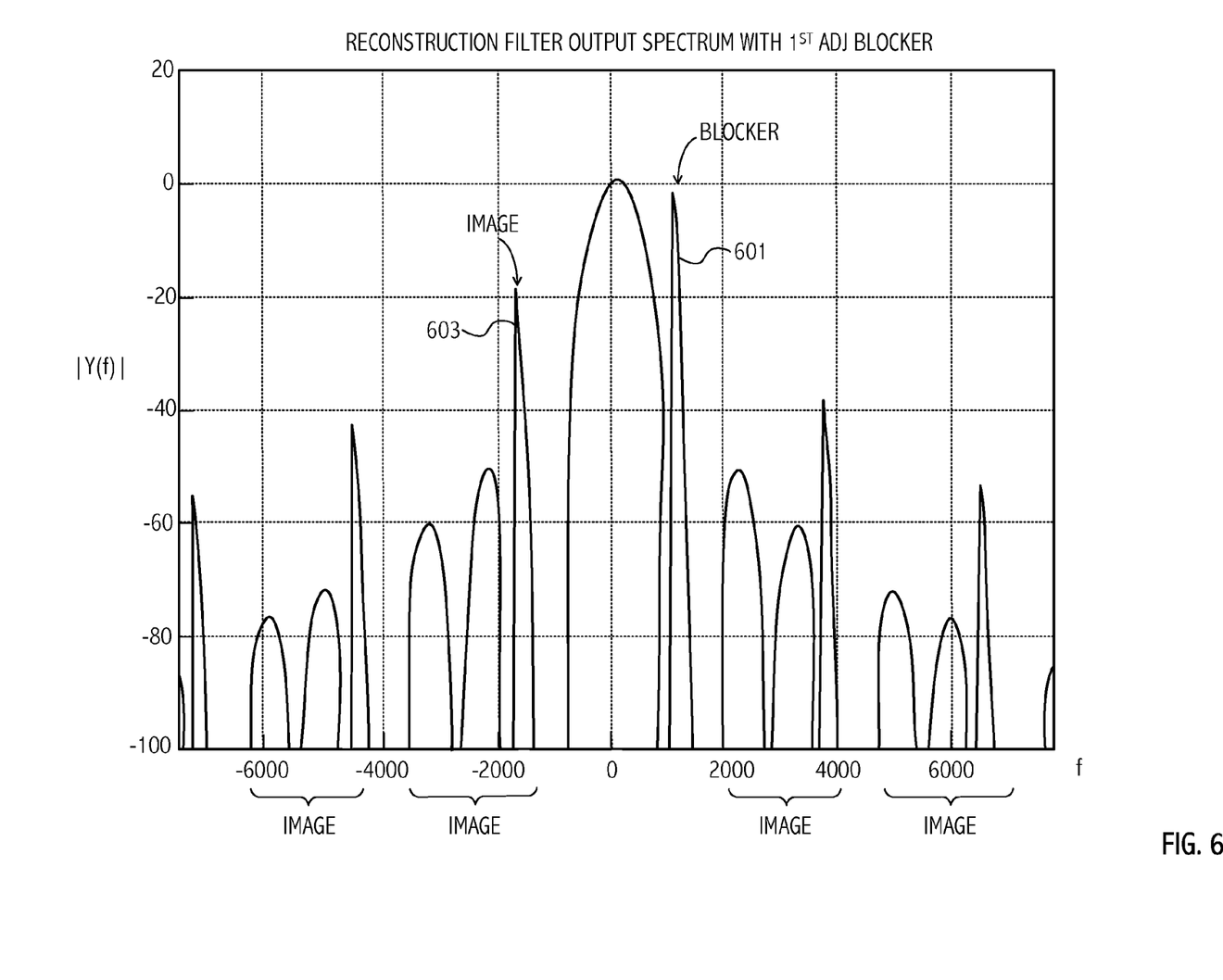
FIG. 6 illustrates the response of the reconstruction filter to the exemplary CIC input spectrum.

FIG. 6 shows the reconstruction filter output spectrum before resampling to fd, with attenuated images at multiples of fs. The blocker is shown at 601 and an image of the blocker at 603. When the relative sampling rates fs and fd change, artifacts will move into the band of interest. However, the careful choice of the sample rate fs (the output rate out of the CIC) and the resample rate fd, helps ensure that the requirements of equation 5 are met in that any artifacts in-band are sufficiently below the desired signal.

Figure 7:
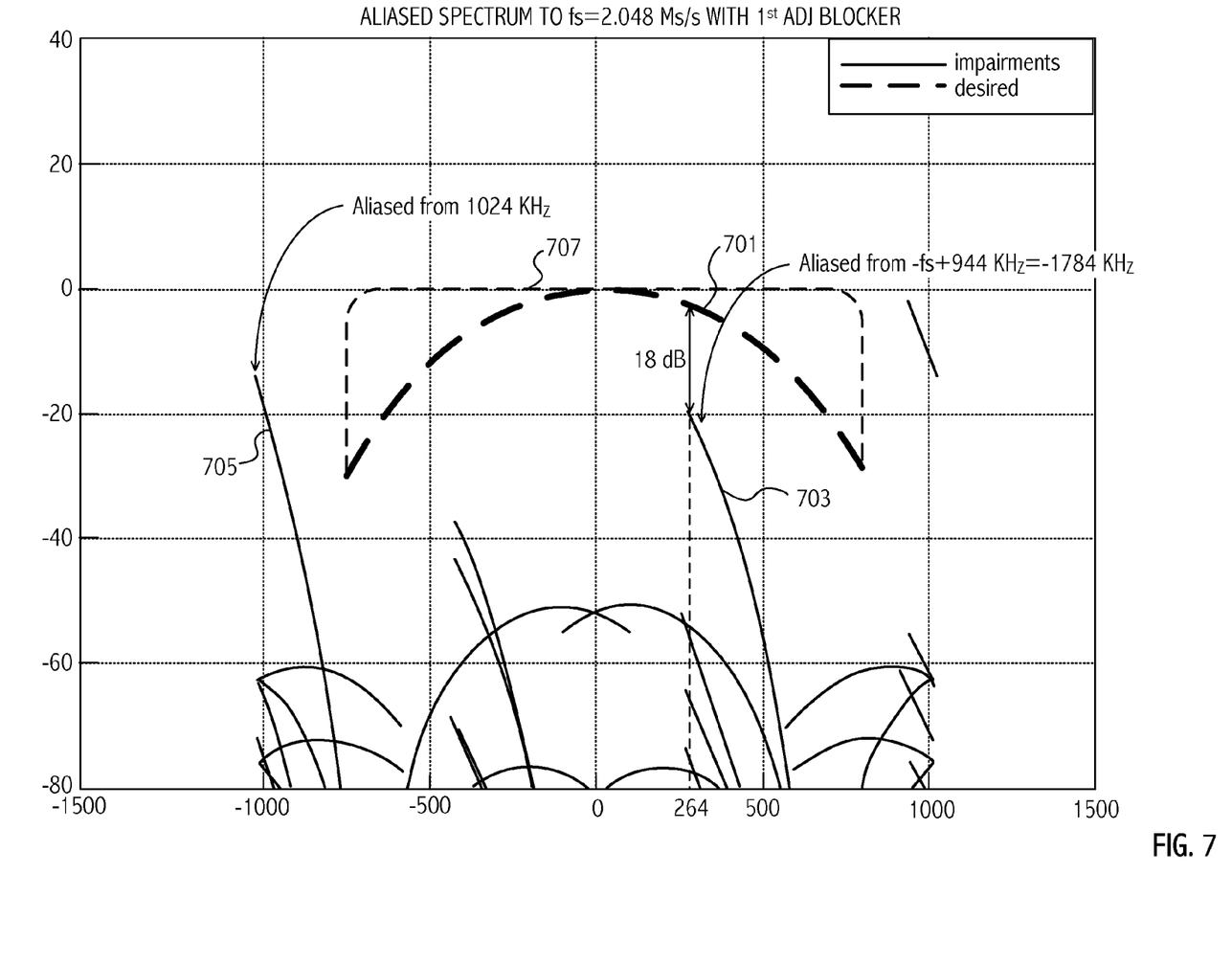
FIG. 7 illustrates exemplary output from the ASRC given the CIC input spectrum of FIG. 5.

With reference to equations 1-5 and FIGS. 4-7, from equation 1 with f=−1784 KHz and fs=2.048 MHz, −1784 kHz aliases to 264 kHz at rate fd=2.048 MHz. FIG. 7 shows the spectrum resampled at fd. That is the output of the ASRC. In the example shown, fd=2.048 MHz. The desired signal is shown as the dashed line 701. The desired signal level Y at 264 kHz=−4 dB.

The largest in-band aliased artifact 703 lands at about 264 kHz that is aliased from the image of the blocker at −1784 kHz shown at 601 in FIG. 6. The blocker is shown at 603. The magnitude of the aliased artifact is about −18 dB relative to the system response at 264 kHz. As can be seen, that meets the requirements of equation 5 with K=15. Another large artifact 705 appears at approximately −1024 kHz that is aliased from 1024 kHz, but the artifact 705 is out of band of the desired signal 701.

Referring back to FIG. 3, droop compensation block 305 receives the output of the ASRC 303. The droop compensation block is intended to compensate for the droop shown in FIG. 7 for the desired signal. The droop compensation block applies compensation that is opposite of the desired signal response shown at 701 so the composite response is flat, such as the dotted line 707.

Figure 8:
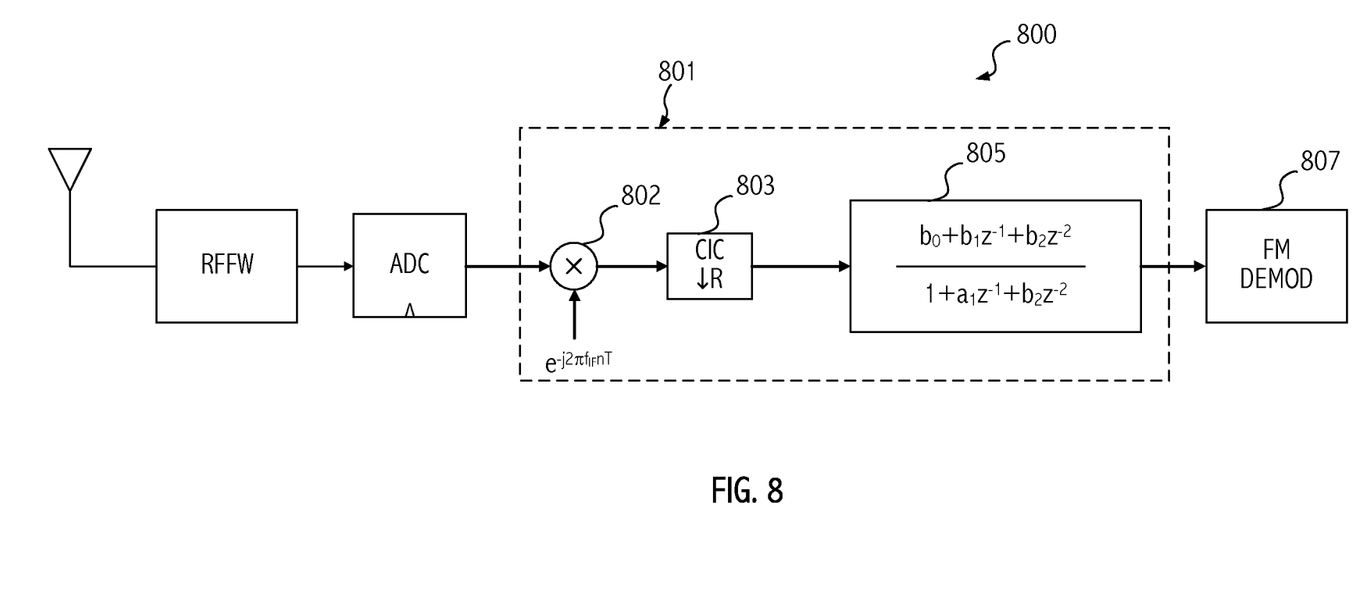
FIG. 8 illustrates an exemplary FM radio digital front end with a droop compensation filter.
Figure 9:
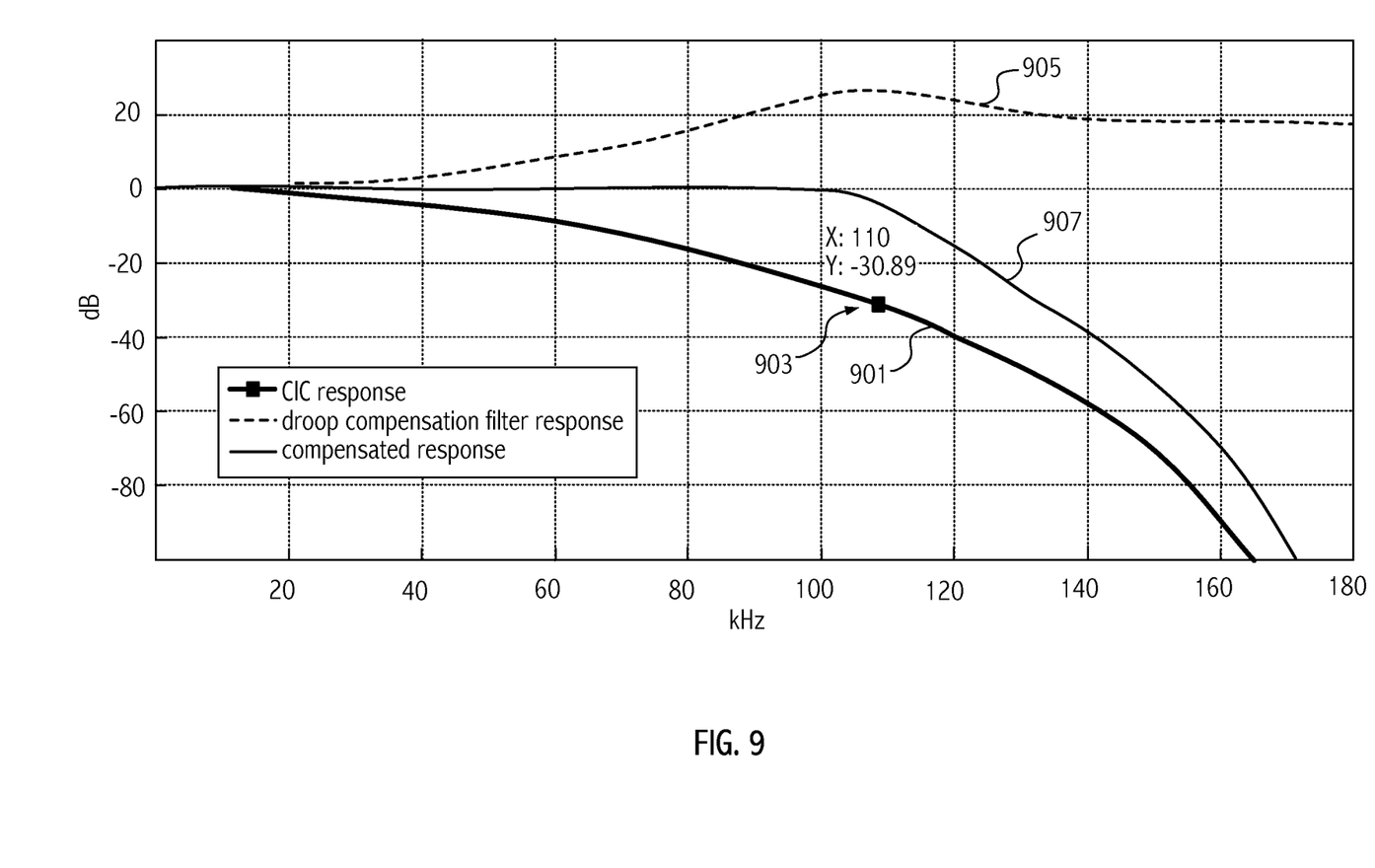
FIG. 9 illustrates an exemplary CIC response, droop compensation filter response, and the droop compensated output for the digital front end of FIG. 8.

FIG. 8 shows an exemplary DFE architecture 801 for an FM receiver 800. The DFE 801 includes frequency rotation 802, a CIC filter 803, and a droop compensation filter 805. Note that no ASRC is required since there is no digital symbol to be tracked. FM demodulation block 807 evaluates phase differences of the received signals. If the phase is not linear, there will be distortion, which can show up, e.g., in imperfect stereo separation in the left and right channels. Therefore, ideal FM demodulation requires linear phase. It is common in building FM receivers therefore to use large ordered filters such as costly finite impulse response (FIR) filters to compensate for phase. However, relaxing the phase linearity requirement allows the use of non-linear phase (or recursive) filters of lesser order. For example, a simple bi-quad filter can be used in droop compensation block 805 to compensate for 30 dB of in-band droop. FIG. 9 shows the CIC response 901 with nearly 31 dB droop at 903. The droop compensation filter response is shown at 905. The compensated response is shown at 907. A FIR filter that would result in similar FM performance (distortion and max stereo separation) would cost 3-4 times more operations per sample.

There are no phase linearity requirements for DAB, which utilizes differential phase demodulation; therefore, a similar, low-order non-linear phase filter can be used. HD radio phase linearity specifications can be met using a similar low-order recursive filter.

Figure 10:
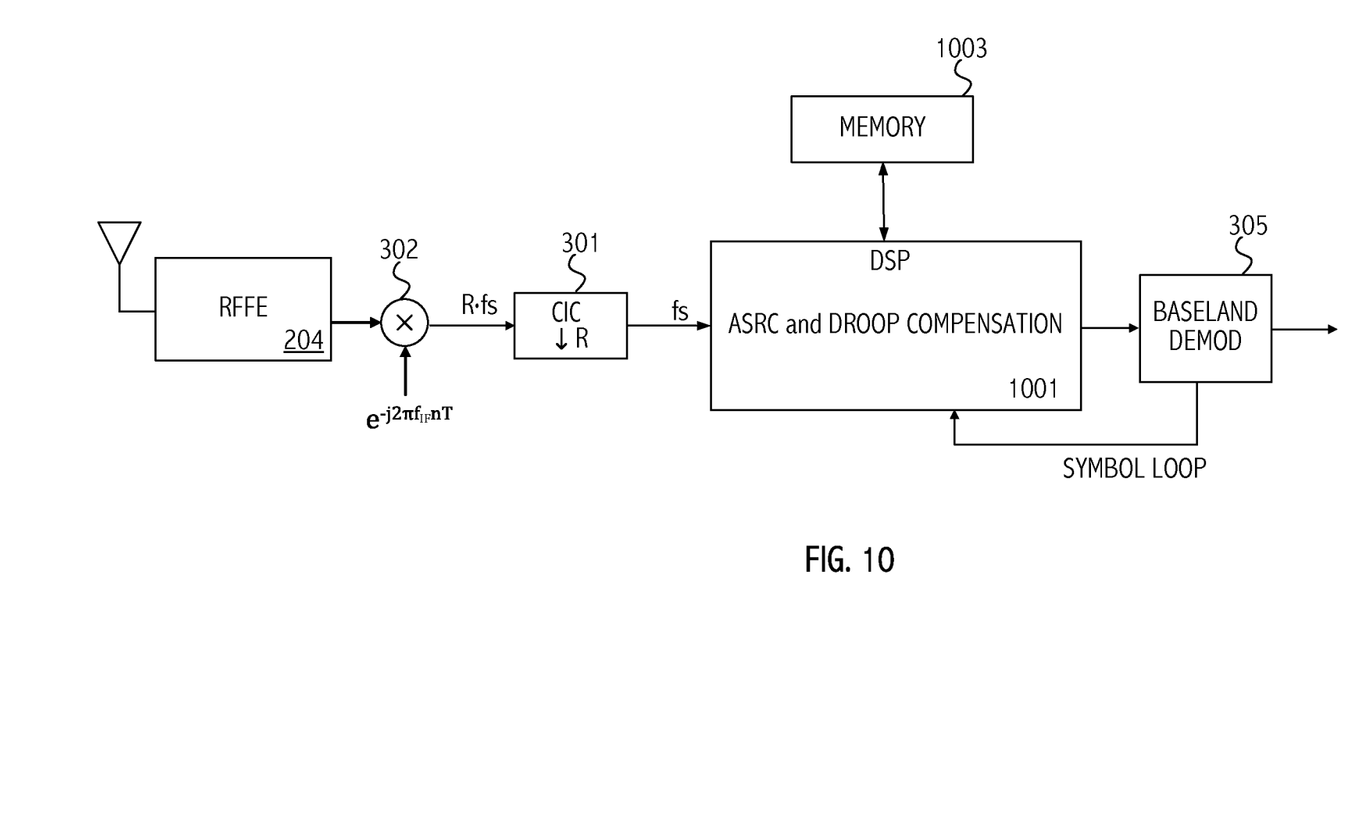
FIG. 10 illustrates an exemplary implementation of a digital front end that utilizes a digital signal processor (DSP).

While the various blocks shown in the digital front end in e.g., FIG. 3, are shown as separate blocks, some or all of the functionality associated with those blocks may be implemented in software and executed on a processor such as a digital signal processor (DSP). Thus, some or all of the filters described herein may be executed on the DSP. In an exemplary high level embodiment shown in FIG. 10, the derotation 302 and CIC filter 301 are implemented in hardware. The ASRC and droop compensation are implemented in DSP 1001. The ASRC filter and droop compensation software are stored in memory 1003. That memory may include a non-volatile memory portion. In addition, memory 1003 may include volatile memory to store data directly from the CIC, and during the various mathematical operations constituting the filter operations. While the CIC and baseband demodulator are shown coupled to the DSP for ease of illustration, the CIC output may be stored directly into the memory for use by the DSP. Similarly, the results of the droop compensation filter are stored in memory 1003 for use by the baseband demodulator. The choice between use of a DSP or a hardware implementation for any particular functionality illustrated may be based on available power and speed of the circuits and system requirements. While some embodiments may utilize a programmable processor (including a DSP) to implement some or all of the functionality described, other embodiments may utilize hardware implemented approaches for speed or to achieve other system requirements.

The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   decimating a digital signal generated by an analog to digital converter;
   supplying the decimated digital signal to an asynchronous sample rate converter (ASRC);
   resampling the decimated digital signal in the ASRC to generate a resampled signal; and
   droop compensating the resampled signal.

2. The method as recited in claim 1 wherein the droop compensating utilizes a non-linear phase filter.

3. The method as recited in claim 1 further comprising supplying an output of the droop compensating to a baseband demodulator.

4. The method as recited in claim 1 wherein the decimating comprises applying a cascaded integrated comb (CIC) decimation filter to the digital signal.

5. The method as recited in claim 4 wherein the analog to digital converter is an oversampled analog to digital converter and the method further comprises converting in the oversampled analog to digital converter (ADC) an analog signal from an analog radio frequency front end (RFFE) into the digital signal.

6. The method as recited in claim 1 wherein a magnitude of a wanted signal in a desired frequency band at an aliased frequency is greater by a predetermined margin K than an aliased image at the aliased frequency in the desired frequency band.

7. The method as recited in claim 1 wherein operation of the ASRC includes resampling at a base rate associated with a digital broadcast.

8. The method as recited in claim 1 further comprising receiving a digital radio signal and supplying an analog signal corresponding to the digital radio signal to the analog to digital converter.

9. The method as recited in claim 1 further comprising using a digital signal processor to resample the decimated digital signal to generate the resampled signal and to droop compensate the resampled signal.

10. The method as recited in claim 1 further comprising implementing the droop compensating at an output rate of the ASRC.

11. A radio receiver comprising:
    a decimation filter to provide a decimated digital signal;

an asynchronous sample rate converter (ASCR) coupled to receive the decimated digital signal and resample the decimated digital signal to provide a resampled signal; and a droop compensator to droop compensate the resampled signal.

12. The radio receiver as recited in claim 11 wherein the droop compensator utilizes a non-linear phase filter.

13. The radio receiver as recited in claim 11 further comprising:
a baseband demodulator coupled to receive an output of the droop compensator.

14. The radio receiver as recited in claim 11 further comprising:
a digital signal processor;
software stored in memory operable, when executed by the processor, to implement one or more of the asynchronous sample rate converter (ASCR) and the droop compensator.

15. The radio receiver as recited in claim 11 wherein the decimation filter comprises a cascaded integrated comb (CIC) decimation filter.

16. The radio receiver as recited in claim 15 wherein operation of the ASRC is mathematically equivalent to passing the digital signal received from the CIC through an ideal digital to analog converter, passing a resulting output from the ideal digital to analog converter through a low-pass reconstruction filter with impulse response h(t), and sampling a resulting signal at a resampling rate different from an output rate of the CIC decimation filter.

17. The radio receiver as recited in claim 11 wherein a magnitude of a wanted signal in a desired frequency band is greater by a predetermined margin K than an aliased image at an aliased frequency of the desired frequency band.

18. The radio receiver as recited in claim 11 further comprising an oversampled analog to digital converter (ADC) to convert an analog signal from an analog radio frequency front end (RFFE) into the digital signal.

19. The radio receiver as recited in claim 11 wherein the droop compensator implements droop compensation at an output rate of the ASRC.

20. A digital radio receiver comprising:
an analog radio frequency front end to receive a digital radio signal and supply an analog output corresponding to the digital radio signal;
an oversampled delta sigma analog to digital converter coupled to receive the analog output and supply a digital signal;
a cascaded integrated comb (CIC) decimation filter coupled to the analog to digital converter to decimate the digital signal to provide a decimated digital signal;
an asynchronous sample rate converter (ASRC) coupled to receive the output of the CIC decimation filter and resample the decimated digital signal to provide a resampled signal; and
a droop compensation filter to droop compensate the resampled signal.

21. The apparatus as recited in claim 20 wherein a magnitude of a wanted signal in a desired frequency band at an aliased frequency in the desired frequency band is greater by a predetermined margin K than an aliased image at the aliased frequency.

22. The apparatus as recited in claim 20 wherein the droop compensation filter is a non-linear phase filter.

* * * * *